(12) United States Patent
Trimberger et al.

(10) Patent No.: US 6,525,560 B1
(45) Date of Patent: Feb. 25, 2003

(54) METHOD AND STRUCTURE FOR SHIPPING A DIE AS MULTIPLE PRODUCTS

(75) Inventors: Stephen M. Trimberger, San Jose, CA (US); Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/017,516

(22) Filed: Dec. 12, 2001

(51) Int. Cl.[7] ............................................. H03K 19/173
(52) U.S. Cl. ............................... 326/38; 326/47; 716/17
(58) Field of Search ............................... 326/37–39, 41, 326/47, 101; 716/17

(56) References Cited

U.S. PATENT DOCUMENTS

| | | | |
|---|---|---|---|
| 5,450,022 A | * 9/1995 | New | ............................ 326/39 |
| 5,587,607 A | 12/1996 | Yasuda et al. | |
| 5,705,938 A | * 1/1998 | Kean | ............................ 326/39 |
| 5,880,596 A | 3/1999 | White | |
| 5,982,043 A | 11/1999 | Iwata | |

OTHER PUBLICATIONS

"Applied Cryptography, Second Edition", by Bruce Schneier, pp. 455–459, published by John Wiley and Sons, 1996.

* cited by examiner

Primary Examiner—Michael Tokar
Assistant Examiner—James H Cho
(74) Attorney, Agent, or Firm—E. Eric Hoffman; Bever, Hoffman & Harms

(57) ABSTRACT

A programmable logic device (PLD) includes a die having first and second bond pads, each being weakly pulled to a first voltage. A package enclosing the die has an external pad configured to receive a second voltage. A conductor couples one and only one of the first and second bond pads to the external pad, such that one bond pad is pulled to the first voltage, and the other bond pad is pulled to the second voltage. A logic circuit on the die is coupled the first and second bond pads. The logic circuit enables the PLD to be configured in response to a first type of bit stream if the first bond pad is pulled to the second voltage, and enables the PLD to be configured only in response to a second type of bit stream if the second bond pad is pulled to the second voltage. In another embodiment, a bond pad is weakly pulled to a first voltage, and can be connected or not connected to an external pin for applying a second voltage.

35 Claims, 5 Drawing Sheets

METHOD AND STRUCTURE FOR SHIPPING A DIE AS MULTIPLE PRODUCTS

FIELD OF THE INVENTION

The present invention relates to programmable logic devices. More specifically, the present invention relates to a method and structure for enabling a programmable logic device to be configured in response to two different types of configuration bit streams.

DESCRIPTION OF RELATED ART

Programmable logic devices (PLDs) include configurable logic circuitry that can be configured to implement various functions in response to configuration bit streams. More specifically, a configuration bit stream is loaded into a configuration memory array on the PLD. The configurable logic circuitry is configured in response to the configuration data values stored in the configuration memory array.

A PLD provider may make several families of devices. For example, Xilinx, Inc., makes a Virtex™ family of field programmable gate arrays (FPGAs) and a Spartan™ family of FPGAs. In general, the Virtex™ family of FPGAs are premium devices, which are capable of providing better performance than the standard, low-cost Spartan™ family of FPGAs. For example, the premium Virtex™ devices are capable of operating at higher speeds than the standard Spartan™ devices. In addition, the premium Virtex™ devices are capable of providing resources, such as dedicated memory, that are not available in the standard Spartan™ devices.

In order to provide different families of PLDS, a PLD provider must fabricate different types of dies for each family of PLDs. In addition, the PLD provider must also establish an inventory system for the dies of the different families.

It would therefore be desirable to have a single die capable of operating as both a premium programmable logic device and a standard programmable logic device. Using the same die to supply both premium and standard programmable logic devices would simplify both fabrication and inventory control.

One issue associated with using the same die to implement both premium and standard programmable logic devices would be controlling the configuration of the die. It would be desirable to prevent a customer who purchases the standard programmable logic device (typically at a lower price than the premium programmable logic device) to configure the die to operate as the premium programmable logic device.

SUMMARY

Accordingly, the present invention provides a programmable logic device that includes a die having a first bond pad and a second bond pad, each being configured to be weakly pulled to a first voltage during normal operation of the programmable logic device. In one embodiment, the first voltage is a logic high voltage. A package enclosing the die includes an external pad configured to receive a second voltage during normal operation of the programmable logic device. If the first voltage is a logic high voltage, then the second voltage is a logic low voltage. A conductor is configured to selectively couple one and only one of first and second bond pads to the external pad, thereby forming an electrical path between the external pad and the selected bond pad. As a result, the bond pad coupled to the external pad is pulled down to the second voltage (e.g., a logic low voltage). The bond pad that is not coupled to the external pad is weakly pulled to the first voltage (e.g., a logic high voltage). The bond pad that is not coupled to the external pad is covered by an encapsulant of the package, thereby preventing a user from modifying the voltage on this bond pad.

The conductor is coupled to the first bond pad to indicate that the programmable logic device is only to be configured as a standard device. Similarly, the conductor is coupled to the second bond pad to indicate that the programmable logic device can be configured as a premium device. In one embodiment, the programmable logic device can be configured as either a premium device or a standard device if the conductor is coupled to the second bond pad.

An enable logic circuit on the die is coupled to the first bond pad and the second bond pad, thereby receiving the voltages on these bond pads. The enable logic circuit enables the die to be configured in response to a premium type of configuration bit stream if the first bond pad is pulled to the first voltage and the second bond pad is pulled to the second voltage. The enable logic circuit may optionally allow the die to be configured in response to the standard type of configuration bit stream if the first bond pad is pulled to the first voltage and the second bond pad is pulled to the second voltage.

Conversely, the enable logic circuit enables the die to be configured only in response to a standard type of configuration bit stream if the first bond pad is pulled to the second voltage and the second bond pad is pulled to the first voltage.

The enable logic circuit must be informed whether an incoming configuration bit stream is a premium or standard type of configuration bit stream in order to make the determination as to whether or not to allow the configuration bit stream to configure the programmable logic device. Thus, the die further includes a decoder circuit configured to receive the configuration bit stream, and determine whether the configuration bit stream is of the premium type or the standard type. Upon making this determination, the decoder circuit transmits a type control signal representative of the determined type of the configuration bit stream to the enable logic circuit.

In an alternative embodiment, only one bond pad on the die is used to indicate whether the programmable logic device can be configured by a premium type configuration bit stream or a standard type configuration bit stream. In this embodiment, the bond pad is coupled to the external pad to identify a premium programmable logic device, or not coupled to the external pad to identify a standard programmable logic device.

The present invention will be more fully understood in view of the following description and drawings.

DETAILED DESCRIPTION

Figure 1:
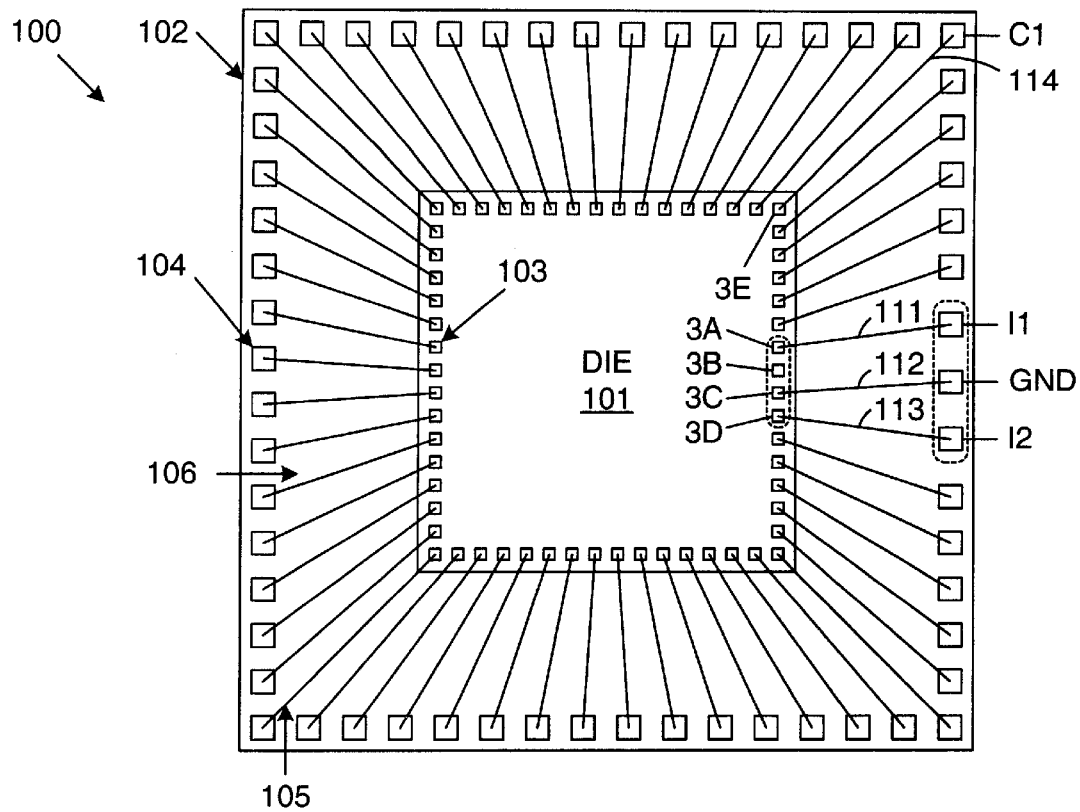
FIG. 1 is a block diagram of a premium programmable logic device in accordance with one embodiment of the present invention.

FIG. 1 is a block diagram of a programmable logic device 100 in accordance with one embodiment of the present invention. Programmable logic device 100 includes die 101 and package 102. Programmable logic, such as a field programmable gate array, is fabricated on die 101. Die 101 can also include dedicated circuitry, including, but not limited to, dedicated multiplier circuits or dedicated random access memory (RAM). In general, die 101 includes circuitry corresponding with a premium product. In one embodiment, die 101 is a Virtex™ compatible die, commonly available from Xilinx, Inc., 2100 Logic Drive, San Jose, Calif. 95124.

Die 101 also includes a plurality of bonding pads 103 located around the perimeter. These bonding pads include pads 3A–3E. Package 102 includes a lead frame that includes a plurality of external package pads/pins 104 located around the perimeter. These external pads/pins 104 include external pads/pins I1, GND, I2 and C1. Package 102 also includes a plurality of bonding wires 105 extending between the bond pads of die 101 and the external pads/pins of package 102. These bonding wires include bonding wires 111–114. Bond wires 111, 112 and 113 connect bond pads 3A, 3C and 3D to external pads/pins I1, GND and I2, respectively. Bond pad 3B is not connected to any external pad in programmable logic device 200. Bond wire 114 connects bond pad 3E with external pad/pin C1. Package 102 also includes an encapsulant 106, which encloses die 101 and bond wires 105. Bond pad 3B is also concealed by encapsulant 106.

In the described example, programmable logic device 100 is configured to enable die 101 to be configured as a premium programmable logic device in response to a premium type configuration bit stream applied to external pad/pin C1. As described in more detail below, the manner of connecting (or not connecting) die bond pads 3B and 3C to the external GND pad determines whether die 101 is enabled to operate as a premium device or a standard device.

Figure 2:
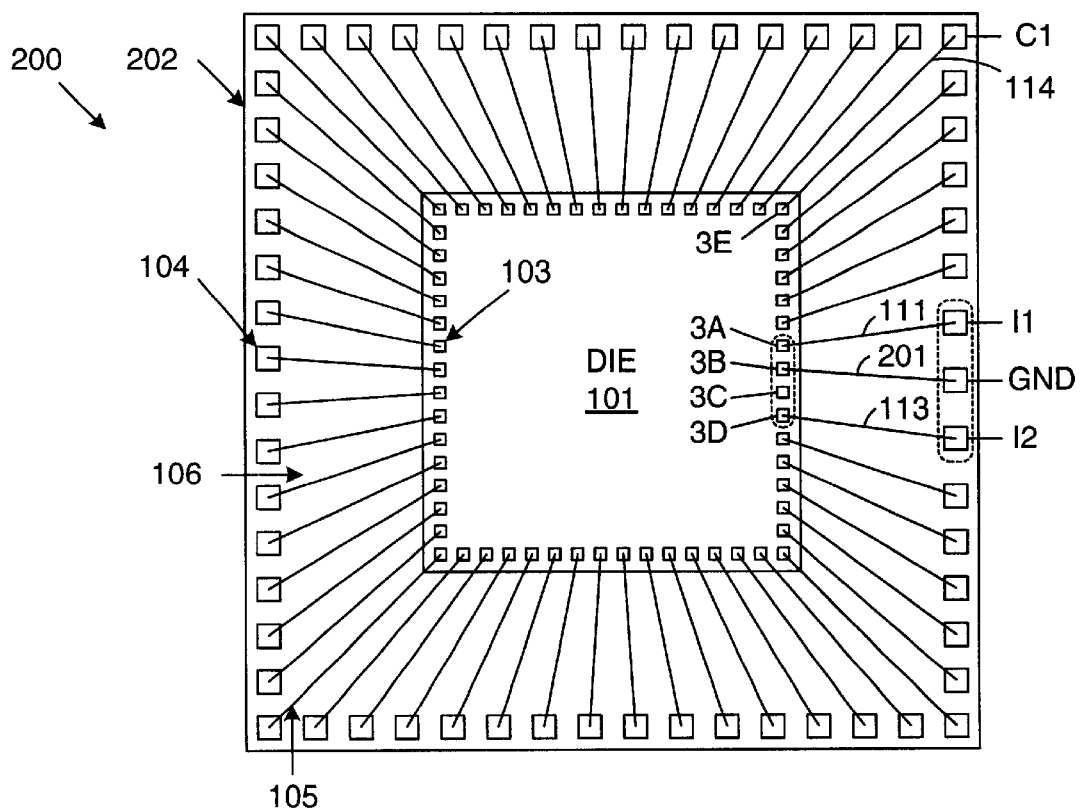
FIG. 2 is a block diagram of a standard programmable logic device in accordance with one embodiment of the present invention.

FIG. 2 is a block diagram of a programmable logic device 200 in accordance with one embodiment of the present invention. Because programmable logic device 200 is similar to programmable logic device 100, similar elements in FIGS. 1 and 2 are labeled with similar reference numbers. Thus, programmable logic device 200 includes die 101 and package 202. It is important to note that programmable logic devices 100 and 200 use identical dies. Package 202 is similar to package 102. However, package 202 includes a set of bond wires 205 having a pattern that is slightly different than the pattern of bond wires 105. More specifically, the set of bond wires 205 includes a bond wire 201 that connects bond pad 3B to the GND pad. Bond pad 3C is not connected to any external pad in programmable logic device 200. Rather, bond pad 3C is concealed by encapsulant 106.

In the described example, programmable logic device 200 is configured to enable die 101 to be configured only as a standard programmable logic device in response to a standard type of configuration bit stream. More specifically, programmable logic device 200 is configured to prevent die 101 from being configured as a premium device (even though die 101 has this capability). As described in more detail below, the manner of connecting (or not connecting) die bond pads 3B and 3C to the external GND pin/pad determines whether die 101 is enabled to operate as a premium device or a standard device.

Figure 3:
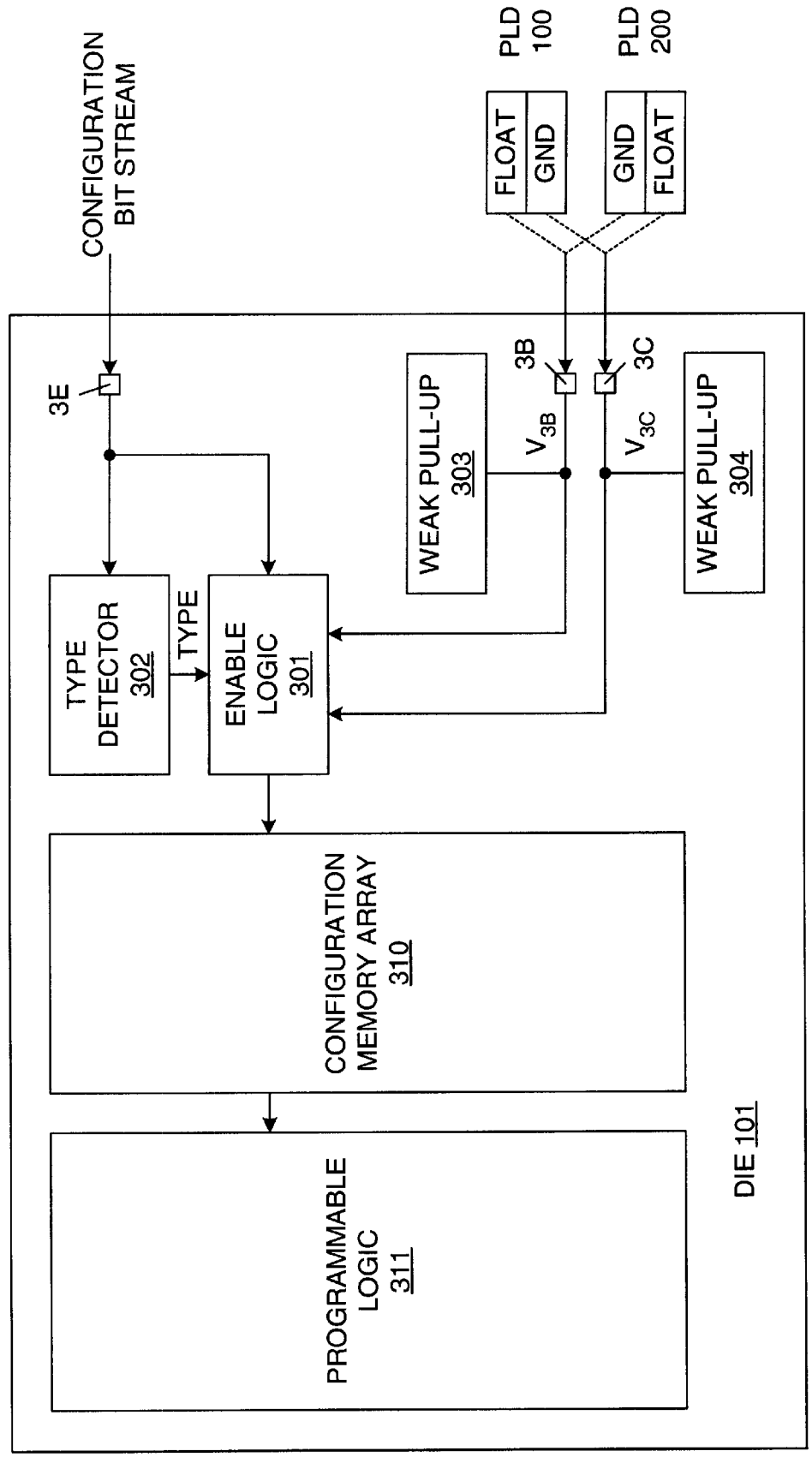
FIG. 3 is a block diagram of a die used in the programmable logic devices of FIG. 1 and FIG. 2 in accordance with one embodiment of the present invention.

FIG. 3 is a block diagram of die 101 in accordance with one embodiment of the present invention. In this embodiment, die 101 includes enable logic block 301, type detector 302, weak pull-up circuits 303–304, configuration memory array 310 and programmable logic 311. Die bond pads 3B and 3C are coupled to weak pull-up circuits 303 and 304, respectively. If no external voltage is applied to pads 3B and 3C, then weak pull-up circuits 303 and 304 will pull up the voltages on these pads 3B and 3C to logic high voltages. The voltages on pads 3B and 3C are designated as voltages $V_{3B}$ and $V_{3C}$, respectively. In one embodiment, each of weak pull-up circuits 303–304 includes a weak p-channel transistor coupled between the corresponding pad 3B–3C and a $V_{DD}$ voltage supply terminal. These p-channel transistors have gates coupled to receive a logic low voltage, such that these p-channel transistors are turned on, thereby tending to pull the voltages $V_{3B}$ and $V_{3C}$ on respective pads 3B and 3C to logic high ("1") voltages.

As illustrated in FIGS. 1 and 2, one of bond pads 3B–3C is connected to an external GND pad, and the other one of bond pads 3B–3C is left floating. More specifically, in programmable logic device 100 (FIG. 1), bond pad 3B is left floating, and bond pad 3C is coupled to the GND pad. Conversely, in programmable logic device 200 (FIG. 2), bond pad 3B is coupled to the external GND pad, and bond pad 3C is left floating.

In the described embodiment, the external GND pad is coupled to receive a ground supply voltage of 0 Volts. As a result, the bond pad (3B or 3C) coupled to the external GND pad is pulled down to a logic low ("0") voltage. Note that the ground supply voltage on the external GND pad overcomes the corresponding weak pull up circuit (303 or 304).

Thus, in programmable logic device 100 (FIG. 1), die pad 3B is pulled up to a logic high ("1") voltage by weak pull-up circuit 303, and die pad 3C is pulled down to a logic low ("0") voltage by the external ground voltage supply. Conversely, in programmable logic device 200 (FIG. 2), die pad 3B is pulled down to a logic low ("0") voltage by the external ground voltage supply, and die pad 3C is pulled up to a logic high ("1") voltage by weak pull-up circuit 304. The voltages on $V_{3B}$ and $V_{3C}$ on die pads 3B and 3C are provided to enable logic 301.

A configuration bit stream is provided to die bond pad 3E in order to configure the programmable logic 311 on die 101. This configuration bit stream includes a TYPE identifier, which indicates the type of device the configuration bit stream is intended to configure. The configuration bit stream will include a TYPE identifier having a first value when the configuration bit stream is intended to configure die 101 as a premium device. The configuration bit stream will include a TYPE identifier having a second value when the configuration bit stream is intended to configure die 101 as a standard device.

Type detector 302 is coupled to receive the configuration bit stream, and in response, extract and decode the TYPE identifier. The TYPE identifier of the configuration bit stream must be protected against modification. In one embodiment, this is accomplished by encrypting the entire configuration bit stream. In another embodiment, this is accomplished by using encryption technology, to authenticate the configuration bit stream in type detector 302.

Authentication techniques are described in the book "Applied Cryptography, Second Edition", by Bruce Schneier, pp. 455–459, published by John Wiley and Sons, 1996. One effective method of authentication is using a symmetric-key encryptor in Cipher Block Chaining (CBC) mode to encrypt the entire bit stream, including the TYPE identifier, as the bit stream arrives on the FPGA, and using only the final CBC register value as the authentication code. For this application, the encryption key may be hard-wired into the programmable logic device, provided the calculation of the matching CBC value in the bit stream maintains the secrecy of the key. Alternately, the TYPE identifier can be hidden in the configuration bit stream so that a user cannot find the TYPE identifier. Type detector 302 provides a TYPE control signal representative of the value of the TYPE identifier to enable logic 301. More specifically, type detector 302 provides a TYPE control signal having a first state (PREMIUM) when the type identifier identifies a premium device, and a second state (STANDARD) when the type identifier identifies a standard device.

Enable logic 301 is also configured to receive the configuration bit stream. Enable logic 301 determines weather the configuration bit stream should be passed to configuration memory array 310 in response to the TYPE control signal and the voltages $V_{3B}$ and $V_{3C}$ on respective die bonds pads 3B and 3C. Table 1 below summarizes the manner in which enable logic 301 operates in accordance with the described embodiment.

TABLE 1

| $V_{3B}$ | $V_{3C}$ | TYPE | ENABLE LOGIC |
|---|---|---|---|
| 1 | 0 | PREMIUM | PASS |
| 0 | 1 | PREMIUM | DON'T PASS |
| 1 | 0 | STANDARD | DON'T PASS |
| 0 | 1 | STANDARD | PASS |
| 1 | 1 | DON'T CARE | DON'T PASS |
| 0 | 0 | DON'T CARE | DON'T PASS |

Thus, for premium programmable logic device 100, the $V_{3B}$ and $V_{3C}$ signals will have logic values of 1 and 0, respectively. If the TYPE control signal has a value of PREMIUM, then enable logic 301 will pass the configuration bit stream to configuration memory array 310. The configuration data values in the configuration bit stream are loaded into the configuration memory array 310 in a manner known in the art. The configuration data values stored in configuration memory array 310 control the configuration of the programmable logic 311 in a manner known in the art.

Table 1 indicates that enable logic 301 will not pass the configuration bit stream to configuration memory array 310 if the programmable logic device is a premium device (i.e., PLD 100 ), and the configuration bit stream is of a STANDARD type. However, in another embodiment, enable logic is configured to pass the configuration bit stream to configuration memory array 310 under these conditions. The reasoning is that because the user has paid for a premium device, the user should be allowed to configure the device at a lower capability.

For standard programmable logic device 200, the $V_{3B}$ and $V_{3C}$ signals will have logic values of 0 and 1, respectively. In this case, enable logic 301 will only pass a STANDARD type configuration bit stream to configuration memory array 310.

Table 1 also indicates that if the $V_{3B}$ and $V_{3C}$ voltages have logic values of 1,1 or 0,0, then enable logic 301 will not pass the configuration bit stream to configuration memory array 310. This is because the 1,1 or 0,0 values indicate that the user is improperly using the programmable logic device. More specifically, a 1,1 value indicates that the user is coupling the GND pad/pin to a logic high voltage, or is leaving the GND pad/pin floating. A 0,0 value indicates that the user has somehow opened package 102, and coupled the encapsulated floating pad (pad 3B in PLD 100 and pad 3C in PLD 200) to a ground voltage supply.

In the foregoing manner, the present invention makes it difficult for a user to configure the programmable logic device in an unintended manner. That is, it is not possible to configure standard programmable logic device 200 as a premium programmable logic device by applying a premium configuration bit stream to standard programmable logic device 200. Thus, standard PLD 200 can be sold at a lower price than premium PLD 100, without concern that a user will be able to configure standard PLD 200 as a premium device.

Figure 4A:
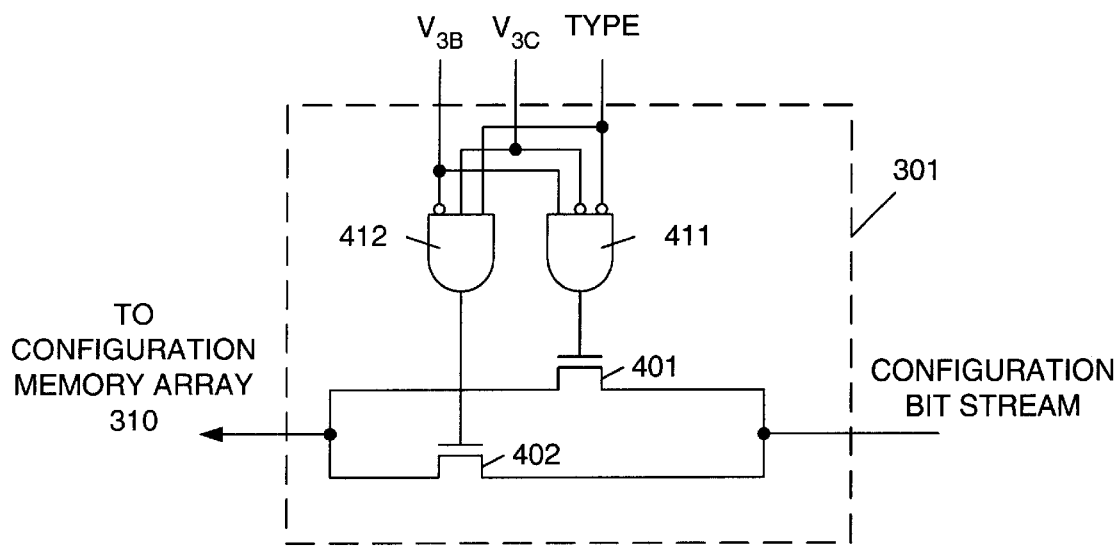
FIGS. 4A–4C are circuit drawings that illustrate enable logic of the die of FIG. 3 in accordance with various embodiments of the present invention.

Enable logic 301 can be implemented in various manners that would be apparent to one of ordinary skill in the art. FIG. 4A is a circuit drawing that illustrates enable logic 301 in accordance with one embodiment. In this embodiment, enable logic 301 includes pass transistors 401 and 402 and logical AND gates 411 and 412. This embodiment assumes that the PREMIUM and STANDARD values of the TYPE control signal correspond with a logic "0" and logic "1" signals, respectively. This embodiment also assumes operation in accordance with Table 1. Thus, if the $V_{3B}$, $V_{3C}$ and TYPE signals have values of 1,0,0, then AND gate 411 provides a logic high signal to turn on pass transistor 401, thereby passing the configuration bit stream to configuration memory array 310. That is, if the $V_{3B}$ and $V_{3C}$ signals identify a premium device, and the TYPE signal identifies the configuration bit stream as a premium type bit stream, then transistor 401 is turned on to pass the configuration bit stream to configuration memory array 310. If the $V_{3B}$, $V_{3C}$ and TYPE signals have values of 0,1,1, then AND gate 412 provides a logic high signal to turn on pass transistor 402, thereby passing the configuration bit stream to configuration memory array 310. That is, if the $V_{3B}$ and $V_{3C}$ signals identify a standard device, and the TYPE signal identifies the configuration bit stream as a standard type bit stream, then transistor 402 is turned on to pass the configuration bit stream to configuration memory array 310. Otherwise, configuration bit stream is not passed to configuration memory array 310.

Figure 4B:
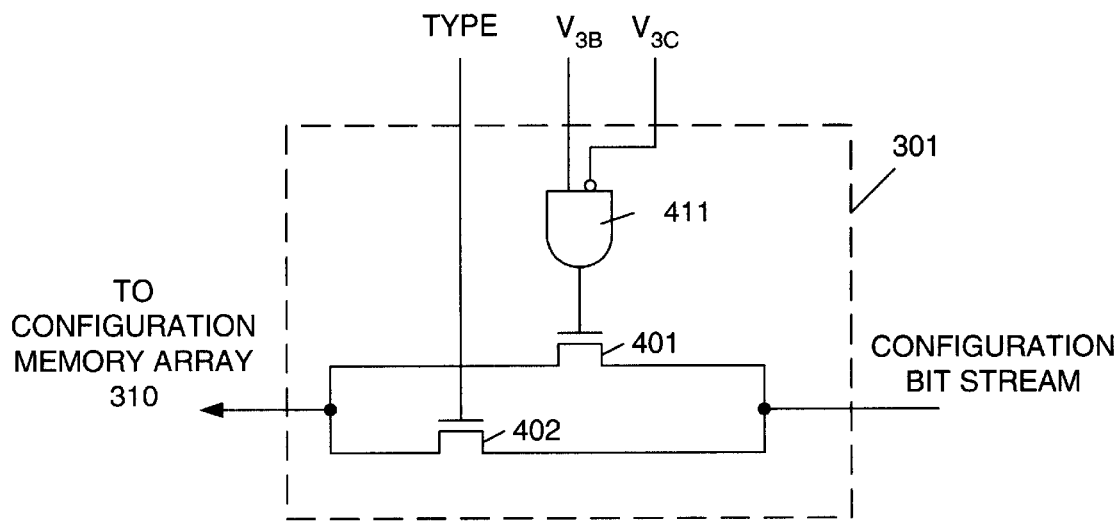

FIG. 4B is a circuit drawing that illustrates enable logic 301 in accordance with another embodiment. In this embodiment, enable logic 301 includes pass transistors 401 and 402 and logical AND gate 411. This embodiment assumes that the PREMIUM and STANDARD values of the TYPE control signal correspond with a logic "0" and logic "1" signals, respectively. Thus, if the $V_{3B}$ and $V_{3C}$ signals have values of 1 and 0, respectively, then AND gate 411 provides a logic high signal to turn on pass transistor 401, thereby passing the configuration bit stream to configuration memory array 310. That is, if the $V_{3B}$ and $V_{3C}$ signals identify a PREMIUM device, then transistor 401 is turned on to pass the configuration bit stream to configuration memory array 310. The TYPE signal is not checked. In this embodiment, a PREMIUM device can accept any bit stream, even a STANDARD bit stream. If the TYPE signal has a value of 1, then pass transistor 402 turns on, thereby passing the configuration bit stream to configuration memory array 310. That is, if the TYPE signal identifies the configuration bit stream as a STANDARD type bit stream, then transistor 401 is turned on to pass the configuration bit stream to configuration memory array 310. Otherwise, configuration bit stream is not passed to configuration memory array 310. In this embodiment, a STANDARD bit stream is acceptable to either a STANDARD or PREMIUM device.

Figure 4C:
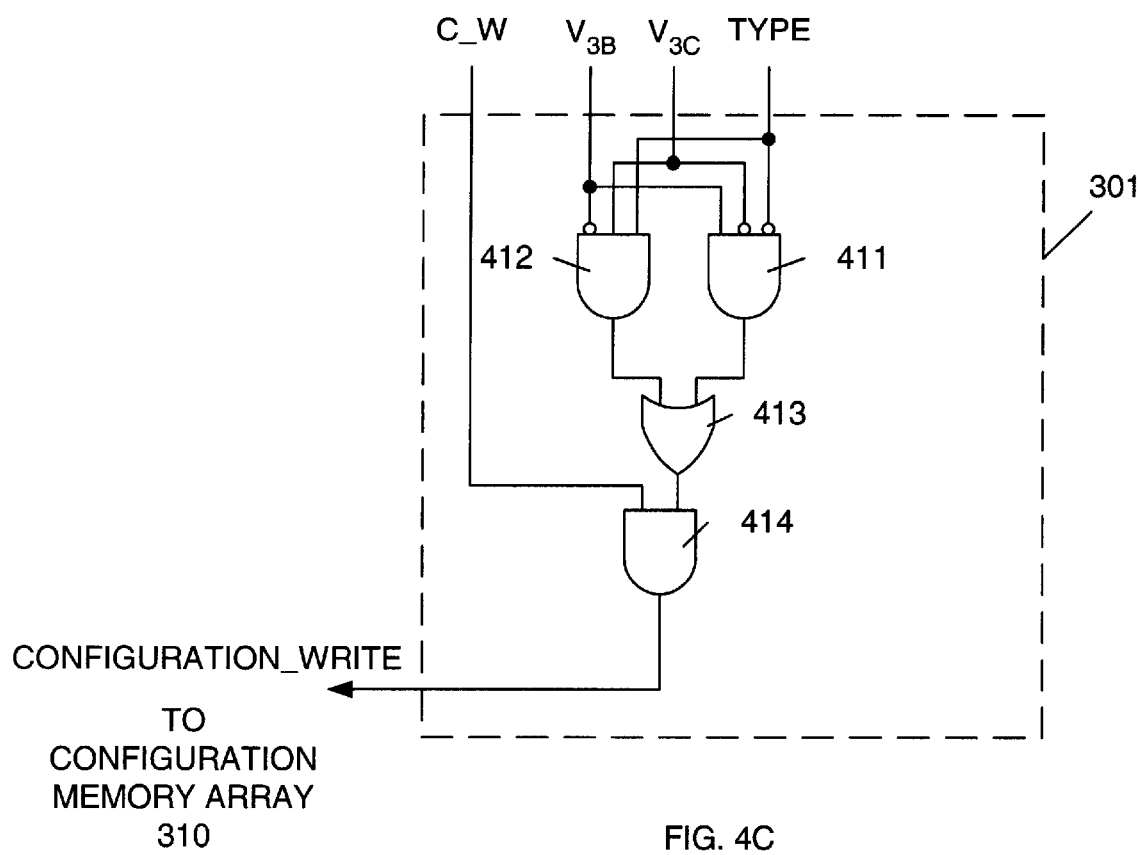

FIG. 4C is a circuit drawing that illustrates enable logic 301 in accordance with another embodiment. In this embodiment, enable logic 301 includes logical AND gates 411–412, logical OR gate 413 and logical AND gate 414. AND gates 411–412 are connected in the same manner described above in FIG. 4A. This embodiment assumes that the PREMIUM and STANDARD values of the TYPE control signal correspond with a logic "0" and logic "1" signals, respectively. Thus, if the $V_{3B}$, $V_{3C}$ and TYPE signals have values of 1,0,0, then AND gate 411 provides a logic high signal to OR gate 413. In response, OR gate 413 provides a logic high signal to AND gate 414. AND gate 414 is also coupled to receive a configuration write signal (C_W), which is the internal signal in the programmable logic device that enables the configuration memory to be written. If the C_W signal is high, then AND gate 414 provides a logic high CONFIGURATION_WRITE signal to configuration memory array 310, thereby enabling the configuration bit stream to be written to configuration memory array 310. Similarly, if the $V_{3B}$, $V_{3C}$ and TYPE signals have values of 0,1,1, then AND gate 412 provides a logic high signal to OR gate 413, thereby causing OR gate 413 to provide a logic high signal to AND gate 414. If the C_W signal is high, then AND gate 414 provides a logic high CONFIGURATION_WRITE signal to configuration memory array 310, thereby enabling the configuration bit stream to be written into configuration memory array 310. In yet another embodiment, the output signal provided by OR gate 413 is logically ANDed with the internal configuration clock of the programmable logic device, or the configuration address lines or any other signal needed to store configuration bit stream data into configuration memory array 310, thereby preventing configuration when OR gate 413 provides a logic low output signal.

Whichever one of the embodiments described above in FIGS. 4A–4C is used to implement enable logic 301, the programmable logic device must initially accept the bit stream data until the TYPE identifier is received. In the circuit of FIG. 4B, this can be done by initializing the TYPE identifier to have a logic "1" (standard) value, thereby initially accepting all of the configuration data values until the TYPE identifier is received. In the circuits of FIGS. 4A and 4C, this can be done by loading a TYPE identifier that is not part of the configuration bit stream into a separate register, so that preventing the configuration bit stream from passing to configuration memory array 310 will not prevent checking the TYPE identifier.

The above-described invention allows the same die 101 to be effectively sold as either a premium device or a standard device. The present invention can also be used to distinguish a high-speed grade device from a low-speed grade device. The present invention can also be used to distinguish a device that is sold at a premium because its bit stream includes a core, such as a PCI core. The specific configuration of the bonding wires can also make an actual functional difference in the device, such as make the device run slower, or disable a PCI compatibility mode.

Advantageously, the voltages $V_{3B}$ and $V_{3C}$ only need to be read at the time that the configuration bit stream is read. As a result, the GND pad/pin can double as a configuration information pin, so that another pin does not need to be used to perform this function.

Figure 5:
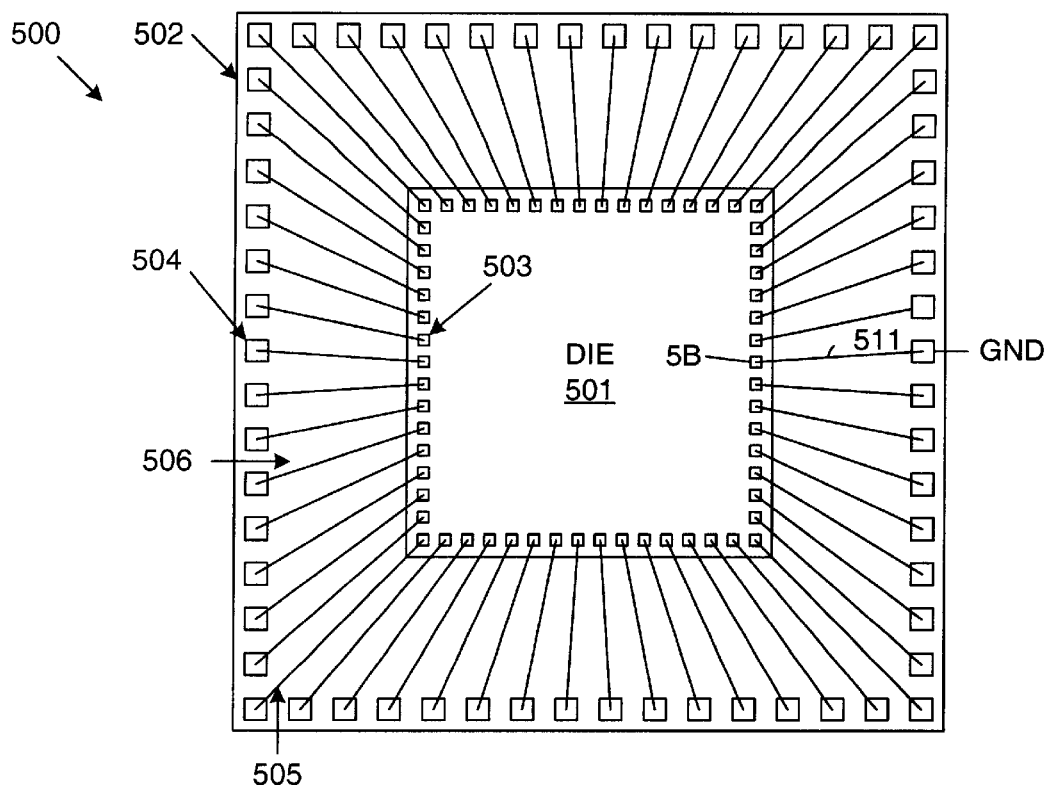
FIG. 5 is a block diagram of a premium programmable logic device in accordance with another embodiment of the present invention.
Figure 6:
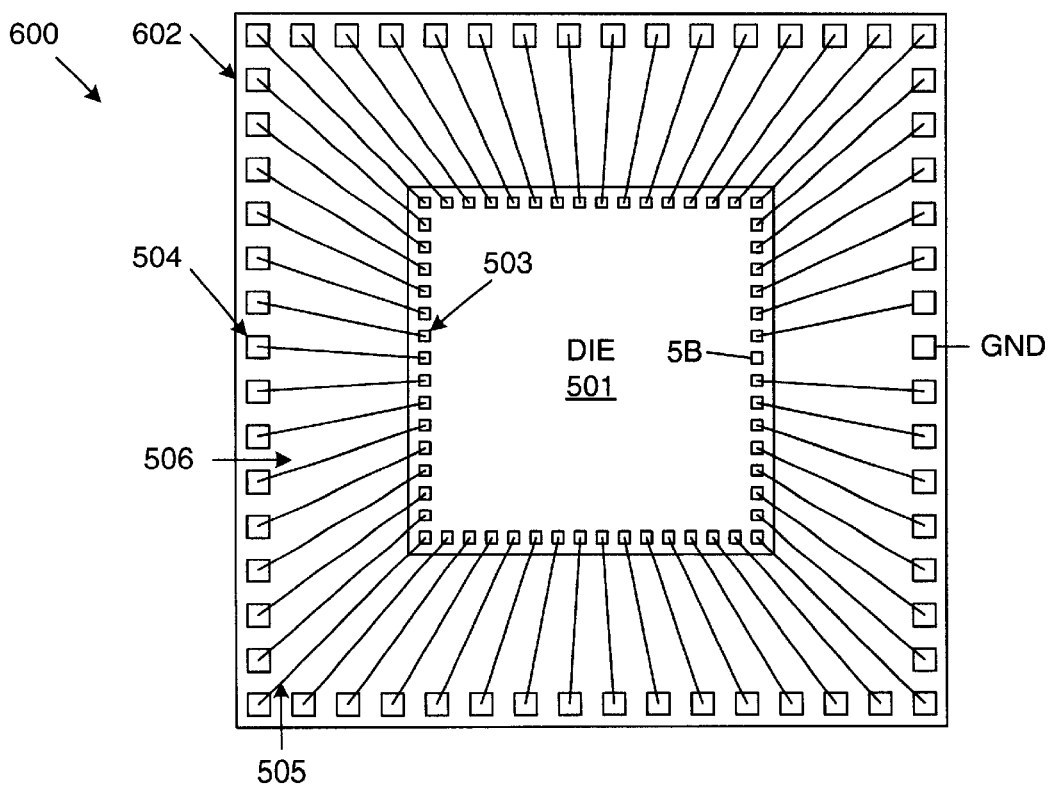
FIG. 6 is a block diagram of a standard programmable logic device in accordance with another embodiment of the present invention.

FIGS. 5 and 6 are block diagrams of programmable logic devices 500 and 600 in accordance with another embodiment of the present invention. In this embodiment, a single pad on the die is used to identify the type of the programmable logic device.

FIG. 5 is a block diagram of a programmable logic device 500 in accordance with one embodiment of the present invention. Programmable logic device 500 includes die 501 (which is similar to die 101) and package 502. Die 501 also includes a plurality of bonding pads 503, including bonding pad 5B, located around the perimeter. Package 502 includes a plurality of external package pads/pins 504, including external pad/pin GND. Package 502 also includes a plurality of bonding wires 505 extending between the bond pads of die 501 and the external pads/pins of package 502. Bond pad 5B is coupled to a weak pull-up circuit in the same manner as bond pads 3B and 3C of die 101. Bond pad 5B is connected to external pad/pin GND by bond wire 511, such that the voltage on bond pad 5B ($V_{5B}$) is pulled down to a logic low voltage. This low voltage ($V_{5B}$) is used to identify programmable logic device 500 as a premium device in a manner similar to that described above in connection with FIGS. 3 and 4.

FIG. 6 is a block diagram illustrating programmable logic device 600. Because programmable logic device 500 is similar to programmable logic device 600, similar elements in FIGS. 5 and 6 are labeled with similar reference numbers. Thus, programmable logic device 600 includes die 501 and package 602. Package 602 is similar to package 502. However, package 602 does not include a bond wire connecting pad 5B to the GND pad/pin. As a result, pad 5B is pulled up to a logic high voltage on die 501. This low voltage ($V_{5B}$) is used to identify programmable logic device 600 as a standard device in a manner similar to that described above in connection with FIGS. 3 and 4. Advantageously, pad 5B is covered by encapsulant 506, such that the user cannot pull down the voltage on die 5B to a logic low level to enable operation as a premium device.

Although the present invention has been described in connection with a package that uses bonding wires, it is understood that the invention is also applicable to a flip chip. In this embodiment, the laminate package of the flip chip is selectively configured to have pad landings for the appropriate solder balls. Thus, the device type is selected depending on the laminate package.

In yet other embodiments, laser trimming or fusible links can be used to provide the desired configuration between the package pads/pins and the die bond pads.

Although the invention has been described in connection with several embodiments, it is understood that this invention is not limited to the embodiments disclosed, but is capable of various modifications, which would be apparent to a person skilled in the art. For example, although the invention has been described in connection with only two types of devices (premium and standard), it is understood that more than two types of devices and bit streams can be implemented in accordance with the teachings of the present invention. Thus, the invention is limited only by the following claims.

What is claimed is:

1. A device that is configured in response to a bit stream, the device comprising:
   a die having a first bond pad and a second bond pad, each being configured to be weakly pulled to a first voltage during normal operation of the device;
   a package that encloses the die, the package having an external pad configured to receive a second voltage during normal operation of the device, the second voltage representing a different logic value than the first voltage;

a conductor coupling one and only one of first and second bond pads to the external pad, wherein the other one of the first and second bond pads is left floating and enclosed by the package;

a logic circuit on the die coupled to the first bond pad and the second bond pad, wherein the logic circuit enables the device to be configured in response to a first type of bit stream if the first bond pad is coupled to the conductor, and wherein the logic circuit enables the device to be configured only in response to a second type of bit stream if the second bond pad is coupled to the conductor.

2. The device of claim 1, wherein the logic circuit also enables the device to be configured in response to the second type of bit stream if the first bond pad is connected to the conductor.

3. The device of claim 1, wherein the second voltage is ground.

4. The device of claim 1, wherein the conductor comprises a bonding wire.

5. The device of claim 1, wherein the conductor comprises a solder ball.

6. The device of claim 1, wherein the conductor comprises a ground plane of the package.

7. The device of claim 1, wherein the device is a field programmable gate array (FPGA).

8. The device of claim 1, wherein the first type of bit stream configures the device to implement a first type of circuit, and the second type of data stream configures the device to implement a second type of circuit.

9. The device of claim 1, wherein the logic circuit includes:

a control circuit coupled to the first and second bond pads, whereby the control circuit is able to determine acceptable types of bit stream in response to voltages on the first and second bond pads; and a decoder circuit coupled to receive the configuration bit stream, determine whether the configuration bit stream is of the first type or the second type, and transmit a type signal identifying the determined type of the configuration bit stream to the control circuit.

10. The device of claim 9, wherein the logic circuit is configured to enable the bit stream to configure the device if the type signal identifies the type of the bit stream as an acceptable type of bit stream.

11. The device of claim 9, wherein the logic circuit is configured to prevent the bit stream from configuring the device unless the voltages on the first and second bond pads are different.

12. The device of claim 9, wherein the bit stream includes means for preventing the type of the bit stream from being forged.

13. The device of claim 12, wherein the means for preventing comprise an authentication code embedded in the bit stream.

14. The device of claim 12, wherein the means for preventing comprise means for encrypting the bit stream.

15. The device of claim 1, wherein the package prevents access to the bond pad that is not coupled to the external pad.

16. A device that is configured in response to a bit stream, the device comprising:

a die having a bond pad configured to be weakly pulled to a first voltage during normal operation;

a package that encloses the die, the package having an external pad configured to receive a second voltage during normal operation, the second voltage representing a different logic value than the first voltage;

a configurable path between the bond pad and the external path;

means for making the configurable path conductive or non-conductive; and a logic circuit on the die coupled to the bond pad, wherein the logic circuit enables the device to be configured in response to a first type of bit stream if the configurable path is conductive, and wherein the logic circuit enables the device to be configured only in response to a second type of bit stream if the configurable path is non-conductive.

17. The device of claim 16, wherein the logic circuit also enables the programmable logic device to be configured in response to the second type of bit stream if the configurable path is conductive.

18. The device of claim 16, wherein the means for making the configurable path conductive or non-conductive comprises a wire bonder.

19. The device of claim 16, wherein the second voltage is ground (0 Volts).

20. The device of claim 16, wherein the bond pad is coupled to the external pad using a bonding wire when the configurable path is conductive.

21. The device of claim 16, wherein the configurable path comprises electrically insulating encapsulant when the configurable path is non-conductive.

22. The device of claim 16, wherein the device is a field programmable gate array (FPGA).

23. The device of claim 16, wherein the first type of bit stream configures the device to implement a first type of circuit, and the second type of data stream configures the device to implement a second type of circuit.

24. The device of claim 16, wherein the logic circuit includes:

a control circuit coupled to the bond pad, whereby the control circuit is able to determine acceptable types of bit stream in response to a voltage on the bond pad; and a decoder circuit coupled to receive the configuration bit stream, determine whether the configuration bit stream is of the first type or the second type, and transmit a type signal identifying the determined type of the configuration bit stream to the control circuit.

25. The device of claim 24, wherein the logic circuit is configured to enable the bit stream to configure the device if the type signal identifies the type of the bit stream as an acceptable type of bit stream.

26. A method of implementing a device comprising a die and a surrounding package, the method comprising:

weakly pulling a first bond pad and a second bond pad on the die toward a first voltage during normal operation of the device;

applying a second voltage to an external pad on the package during normal operation of the device, wherein the second voltage is selectively applied to one and only one of the first and second bond pads, the second voltage representing a different logic value than the first voltage;

enabling the device to be configured in response to a first type of bit stream only if the first bond pad is pulled to the first voltage and the second bond pad is pulled to the second voltage; and enabling the device to be configured in response to a second type of bit stream if the first bond pad is pulled to the second voltage and the second bond pad is pulled to the first voltage.

27. The method of claim 26, further comprising enabling the device to be configured only in response to a second type of bit stream if the first bond pad is pulled to the second voltage and the second bond pad is pulled to the first voltage.

28. The method of claim 26, further comprising creating a conductive path between the external pad and one and only one of the first and second bond pads.

29. The method of claim 26, further comprising selecting the second voltage to be ground (0 Volts).

30. The method of claim 26, further comprising:

configuring the device to implement a first type of circuit in response to the first type of bit stream; and configuring the device to implement a second type of circuit in response to the second type of bit stream.

31. The method of claim 26, further comprising determining whether the configuration bit stream is of the first type or the second type on the die.

32. A method of implementing a device that is configured in response to a bit stream, the method comprising:

configuring a bond pad on a die to be weakly pulled to a first voltage during normal operation of the device;

enclosing the die within a package that includes an external pad configured to receive a second voltage during normal operation of the device, the second voltage representing a different logic value than the first voltage;

coupling the bond pad to the external pad, or preventing the bond pad from being coupled to the external pad;

enabling the device to be configured in response to a first type of bit stream if the bond pad is coupled to the external pad; and enabling the device to be configured only in response to a second type of bit stream if the bond pad is not coupled to the external pad.

33. The method of claim 32, further comprising enabling the device to be configured in response to the second type of bit stream if the bond pad is coupled to the conductor.

34. The method of claim 32, further comprising selecting the second voltage to be ground (0 Volts).

35. The method of claim 32, further comprising:

configuring the device to implement a first type of circuit in response to the first type of bit stream; and configuring the device to implement a second type of circuit in response to the second type of bit stream, wherein the first type of circuit provides more functionality than the second type of circuit.

\* \* \* \* \*